(12) United States Patent
Okano et al.

(10) Patent No.: US 11,817,513 B2
(45) Date of Patent: Nov. 14, 2023

(54) PHOTODETECTOR DESIGNING METHOD FOR PHOTODETECTOR HAVING PHOTOELECTRIC CONVERSION LAYER MOSTLY COMPOSED OF AMORPHOUS SELENIUM AND LAYER THICKNESS DESIGNING METHOD THEREOF, PHOTODETECTOR USING THE PHOTOELECTRIC CONVERSION LAYER AND PHOTODETECTOR MANUFACTURING METHOD THEREOF, AND STORAGE MEDIUM

(71) Applicants: EIWA BUSSAN CO., LTD., Tokyo (JP); Ken Okano, Tokyo (JP)

(72) Inventors: Ken Okano, Tokyo (JP); Joshua Dumenkosi John, Tokyo (JP)

(73) Assignees: EIWA BUSSAN CO., LTD., Tokyo (JP); Ken Okano, Tokyo (JP)

( * ) Notice: Subject to any disclaimer, the term of this patent is extended or adjusted under 35 U.S.C. 154(b) by 0 days.

(21) Appl. No.: 18/074,009

(22) Filed: Dec. 2, 2022

(65) Prior Publication Data

US 2023/0095246 A1 Mar. 30, 2023

Related U.S. Application Data

(63) Continuation of application No. PCT/JP2020/032600, filed on Aug. 28, 2020.

(51) Int. Cl.
*H01L 31/0352* (2006.01)
*H01L 31/0224* (2006.01)
(Continued)

(52) U.S. Cl.
CPC .. *H01L 31/035245* (2013.01); *H01L 31/0272* (2013.01); *H01L 31/022466* (2013.01); *H01L 31/20* (2013.01)

(58) Field of Classification Search
CPC ..... H01L 31/035245; H01L 31/022466; H01L 31/0272; H01L 31/20
See application file for complete search history.

(56) References Cited

U.S. PATENT DOCUMENTS

2004/0159775 A1 8/2004 Sundaram et al.
2010/0182471 A1 7/2010 Toda
2011/0149102 A1 6/2011 Toda

FOREIGN PATENT DOCUMENTS

JP 7-169931 A 7/1995
JP 2006-216626 A 8/2006
(Continued)

OTHER PUBLICATIONS

Masuzawa T, Saito I, Yamada T, Onishi M, Yamaguchi H, Suzuki Y, Oonuki K, Kato N, Ogawa S, Takakuwa Y, Koh AT, Chua DH, Mori Y, Shimosawa T, Okano K. Development of an amorphous selenium-based photodetector driven by a diamond cold cathode. Sensors (Basel). Oct. 11, 2013;13(10):13744-78 (Year: 2013).*

(Continued)

*Primary Examiner* — Matthew L Reames
(74) *Attorney, Agent, or Firm* — Thomas W. Cole; Calderon Safran & Cole P.C.

(57) ABSTRACT

A photodetector designing method includes, according to various requirements required by an application equipped with a photodetector including a photoelectric conversion layer having a superlattice structure mostly composed of amorphous selenium, a step of determining a form of the photodetector; a step of determining a type of a substrate suitable for a wavelength to be detected by the photoelectric conversion layer among the requirements, a step of calculating a multiplication factor M representing an amplification gain generated in a process of tunneling in the superlattice structure, and a step of determining, as a layer thickness of the photoelectric conversion layer, a thickness (Continued)

obtained by multiplying a thickness per one layer of the superlattice structure by the number of layers $N_{SL}$ of the superlattice structure on the assumption that the multiplication factor M is approximate to the number of layers $N_{SL}$.

9 Claims, 8 Drawing Sheets

(51) Int. Cl.
*H01L 31/0272* (2006.01)
*H01L 31/20* (2006.01)

(56) References Cited

FOREIGN PATENT DOCUMENTS

| JP | 2011-146635 A | 7/2011 |
|---|---|---|
| JP | 2019-212848 A | 12/2019 |
| WO | 2007113899 A | 10/2007 |

OTHER PUBLICATIONS

International Search Report and Written Opinion issued in corresponding Application No. PCT/JP2020/032600 dated Nov. 10, 2020.
John, J. D. et al., Transport properties of Se/As2Se3 nanolayer super lattice fabricated using rotational evaporation, Advanced Functional Materials, Aug. 8, 2019, vol. 2 9, p. 1904758-1 to 1904758-8, abstract, fig. 3., etc.

\* cited by examiner

PHOTODETECTOR DESIGNING METHOD FOR PHOTODETECTOR HAVING PHOTOELECTRIC CONVERSION LAYER MOSTLY COMPOSED OF AMORPHOUS SELENIUM AND LAYER THICKNESS DESIGNING METHOD THEREOF, PHOTODETECTOR USING THE PHOTOELECTRIC CONVERSION LAYER AND PHOTODETECTOR MANUFACTURING METHOD THEREOF, AND STORAGE MEDIUM

TECHNICAL FIELD

The present invention relates to a method for designing a photodetector, and in particular, a method for designing a photodetector having a photoelectric conversion layer mostly composed of amorphous selenium, a method for designing a layer thickness, a photodetector using the photoelectric conversion layer, and a manufacturing method thereof.

BACKGROUND ART

Conventionally, the signal amplification effect, which amplifies the electric signal when a high electric field is applied to amorphous selenium has been reported. Recently, a photodetector using amorphous selenium as a photoelectric conversion layer has been developed by utilizing this property. For example, in Patent Literature 1 and Patent Literature 2, a photoelectric conversion layer containing amorphous selenium is formed on a substrate, and a functional layer for removing noise, which might causes less amplification effect is additionally formed, have been disclosed.

CITATION LIST

Patent Literature

[Patent Literature 1] Japanese Published Unexamined Patent Application Publication No. 2011-146635
[Patent Literature 2] Japanese Published Unexamined Patent Application Publication No. 2019-212848

SUMMARY OF THE INVENTION

Technical Problem

However, in the above documents, after forming a photoelectric conversion layer containing amorphous selenium in a prescribed manner, a functional layer that assists the function of the photoelectric conversion layer is added by ingenuity so that the desired effect of a device can be obtained. Therefore, there is a problem that it takes time and man-hours to design the functional layer in order to manufacture a photodetector that realizes desired performance.

The present invention has been made based on the problems of the prior invention, an object of the present invention is to provide a device designing that desired performance can be achieved without adding a functional layer by designing a photoelectric conversion layer (amorphous selenium layer) based on quantum mechanics.

Solution to the Problem

In order to solve the above-described problem, a photodetector designing method according to an aspect of the present invention includes: according to various requirements required by an application equipped with a photodetector including a photoelectric conversion layer having a superlattice structure mostly composed of amorphous selenium, a step of determining a form of the photodetector; a step of determining a type of a substrate suitable for a wavelength to be detected by the photoelectric conversion layer among the requirements; a step of calculating a multiplication factor M representing an amplification gain generated in a process of tunneling in the superlattice structure; and a step of determining, as a layer thickness of the photoelectric conversion layer, a thickness obtained by multiplying a thickness per one layer of the superlattice structure by the number of layers $N_{SL}$ of the superlattice structure on the assumption that the multiplication factor M is approximate to the number of layers $N_{SL}$.

In the aspect described above, it is also preferable that the multiplication factor M is calculated by the following equation by using a collector current $I_c$ from a light receiving device of the photodetector using the photoelectric conversion layer, a dark current $I_D$ of the photodetector, and the number of photons $N_{00}$ serving as carriers in the tunneling, provided that q is a basic electronic charge.

In the aspect described above, it is also preferable that, when the photodetector has a vacuum gap, a correction coefficient γ for increasing the multiplication factor M is included in the multiplication factor M. In order to solve the above-described problem, a layer thickness designing method according to an aspect of the present invention is a method for designing a thickness of a photoelectric conversion layer having a superlattice structure mostly composed of amorphous selenium, and includes: the number of layers $N_{SL}$ of the superlattice structure is obtained from a multiplication factor M representing an amplification gain generated in a process of tunneling in the superlattice structure, and a layer thickness of the photoelectric conversion layer is determined.

In order to solve the above-described problem, it is also preferable that a photodetector manufacturing method by laminating the photoelectric conversion layer on the substrate by rotational evaporation by matching the number of layers $N_{SL}$ with the number of rotations of a turntable.

In the aspect of described above, in the photodetector manufacturing method, it is also preferable that the superlattice structure is made of selenium and arsenic triselenide.

In order to solve the above-described problem, it is also preferable that a photodetector includes: in order from a light incidence side, a first substrate including a transparent electrode; a photoelectric conversion layer having a superlattice structure mostly composed of amorphous selenium and having a layer thickness obtained by multiplying a thickness per one layer of the superlattice structure by the number of layers $N_{SL}$ of the superlattice structure approximate to a multiplication factor M representing an amplification gain generated in a process of tunneling in the superlattice structure; and a second substrate of a substrate type which is suitable for a requirement for a wavelength to be detected by the photoelectric conversion layer and on which the photoelectric conversion layer is laminated.

In order to solve the above-described problem, it is also preferable that a photodetector includes: in order from a light incidence side, a first substrate including a transparent electrode, an anode layer having a superlattice structure mostly composed of amorphous selenium and having a layer thickness obtained by multiplying a thickness per one layer of the superlattice structure by the number of layers $N_{SL}$ of the superlattice structure approximate to a multiplication factor M representing an amplification gain generated in a process of tunneling in the superlattice structure; a vacuum gap; and a cathode layer.

Also, a storage medium storing a computer program of the photodetector designing method according is also preferable.

Effect of Invention

The present invention enables to provide electronic devices having desired performance by designing its photoelectric conversion layer (amorphous selenium layer) based on quantum mechanics.

DESCRIPTION OF EMBODIMENTS

Next, preferred embodiments of the present invention will be described with reference to the drawings. The present invention is not limited to the embodiments described here, and various modifications can be made based on the knowledge of a person skilled in the art. For example, although the photoelectric conversion layer of the embodiments is mostly composed of amorphous selenium, it is presumed that the same layer thickness design method, photodetector, and manufacturing method can be implemented even if the photoelectric conversion layer is mostly composed of chalcogenide semiconductor. It is understood that such aspects are also included in the scope of the present invention.

In a conventional photodetector using amorphous selenium as a photoelectric conversion layer, or an application equipped with a photodetector, first, an amorphous selenium layer is formed by a method using molecular beam epitaxy in a specified manner, next, a functional layer is additionally designed in order to sublimate the signal amplification to meets requirements of an application.

On the other hand, in the embodiments, photodetectors are each included an amorphous selenium layer, the layer thickness of the amorphous selenium layer (the number of layers) is predicted and formed to obtain the signal amplification effect necessary to meet requirements of the application without adding a functional layer. This layer thickness (the number of layers) is calculated based on quantum mechanics. Then, depending on what kind of substrate the amorphous selenium layer is laminated on, it is possible to detect light in various optical regions, and it is possible to customize the performance according to the requirements of the application. Hereinafter, this device designing will be described.

Form of Photodetector

First, configuration of a photodetector that preferably carries out the present invention will be described.

First Embodiment

Figure 1:
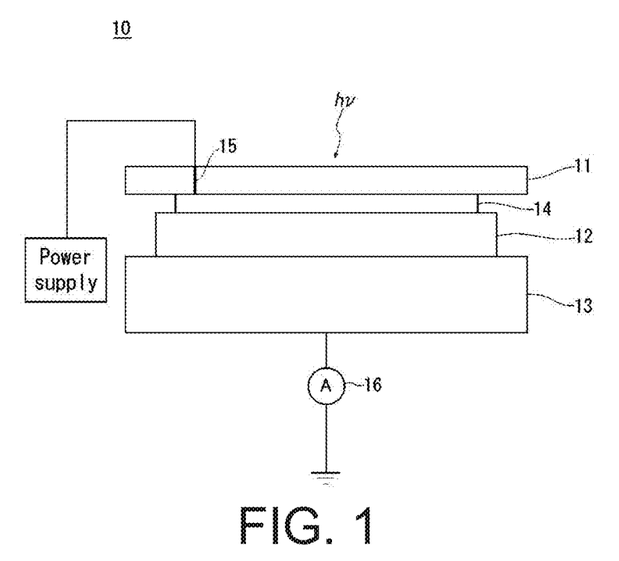
FIG. 1 is a schematic configuration of a cross-sectional view of a photodetector (imaging device form) according to a first embodiment.

FIG. 1 is a schematic configuration of the sectional view of a photodetector 10 (imaging device form) according to the embodiment of the present invention. The photodetector 10 according to the embodiment includes a substrate 11 having a transparent electrode 14, an amorphous selenium layer 12, and a second substrate 13 in this order from the light incident side. For the substrate 11, various materials that transmit light, such as a glass substrate or a transparent resin, beryllium for X-rays, sapphire or yttrium oxide for ultraviolet rays, may be used. For the transparent electrode 14, an oxide semiconductor such as an ITO layer (Indium Tin Oxide) or IGZO (registered trademark), graphene, a conductive polymer, or the like may be used.

When a high electric field is applied to the amorphous selenium layer 12 through the through hole 15 provided in the substrate 11, the photodetector 10 amplifies the incident light energy and performs photoelectric conversion. The amorphous selenium layer 12 is a photoelectric conversion layer. The signal amplification effect varies depending on the structure of the amorphous selenium layer 12. A readout circuit (light receiving device) 16 connected to the photodetector 10 reads out the signal current and thus detecting the light.

Second Embodiment

Figure 2:
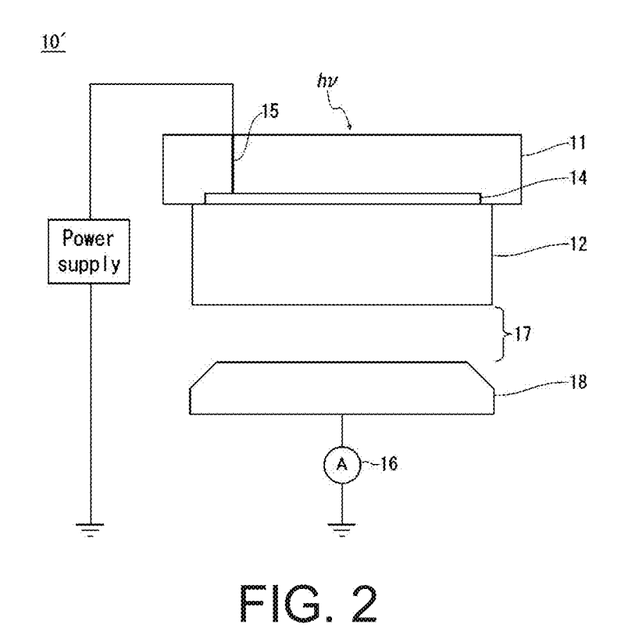
FIG. 2 is a schematic configuration of a cross-sectional view of a photodetector (vacuum type imaging device form) according to a second embodiment.

FIG. 2 is a schematic configuration of the sectional view of the photodetector 10' (vacuum type imaging device form) according to the second embodiment of the present invention. The same elements as those in the first embodiment will be omitted from the description by using the same reference signs. The photodetector 10' according to the second embodiment has a glass substrate 11 provided with a transparent electrode 14, an amorphous selenium layer 12 (anode layer), a vacuum gap 17, and a nitrogen-doped diamond cold cathode layer 18 in this order from the light incident side.

In the photodetector 10', when a high electrifield is applied to the amorphous selenium layer 12 through the through hole 15 provided in the glass substrate 11, the incident light energy is signal-amplified and photoelectrically converted. The signal amplification effect varies depending on the structure of the amorphous selenium layer 12. Further, an increase in high input impedance can be obtained by having the vacuum gap 17 and the diamond cold cathode layer 18. A readout circuit (light receiving device) 16 connected to the photodetector 10' reads out the signal current and thus detecting the light.

Device Designing

Next, the device designing of these embodiments will be described.

Designing of Substrate

Figure 3:
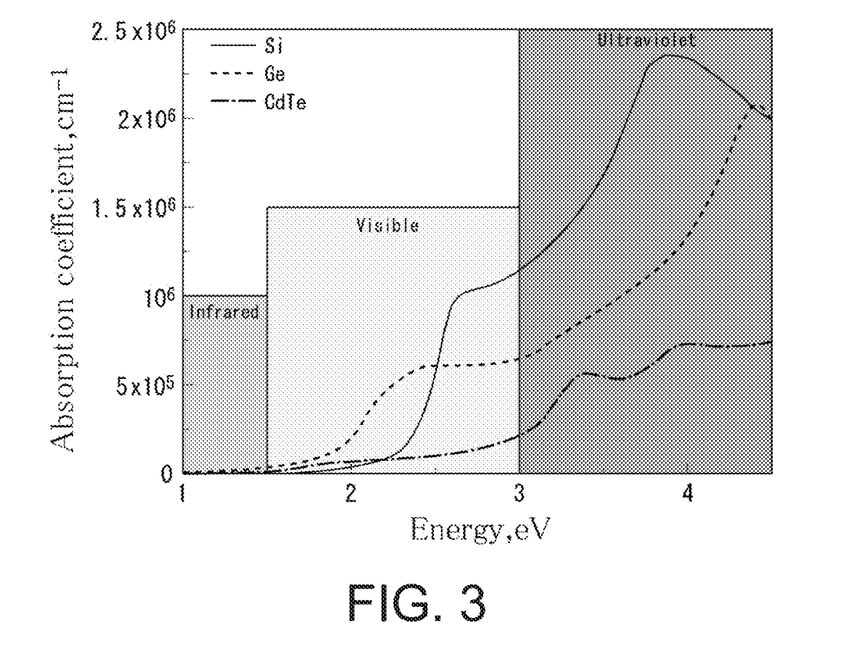
FIG. 3 is a graph of absorption of infrared, visible, and ultra-violet lights depending on substrate types.

Since the second substrate 13 also functions as a photon absorber, it can absorb photons of different energies depending on the type of substrate. Therefore, the photodetector 10 can be extended to a wavelength spectrum in a wide optical region. FIG. 3 is a graph of absorption coefficients of infrared light, visible light, and ultra-violet light depending on the type of substrate. Using three materials, such as silicon (Si), germanium (Ge), and cadmium telluride (CdTe) are used as the substrate, the absorption coefficient when irradiated with infrared light, visible light, and ultraviolet light is measured, and plotted in which the horizontal axis is the electron energy [eV] and the vertical axis is the absorption coefficient [cm$^{-1}$]. From the absorption coefficient spectrum of each material, it is possible to determine which substrate is suitable for desired application. It is most suitable to use a Ge substrate for infrared detection, and the tendency continues up to a low energy visible light region of about 2 eV. The Si substrate is most suitable for detecting high-energy photons in the ultraviolet light region and beyond.

Figure 4:
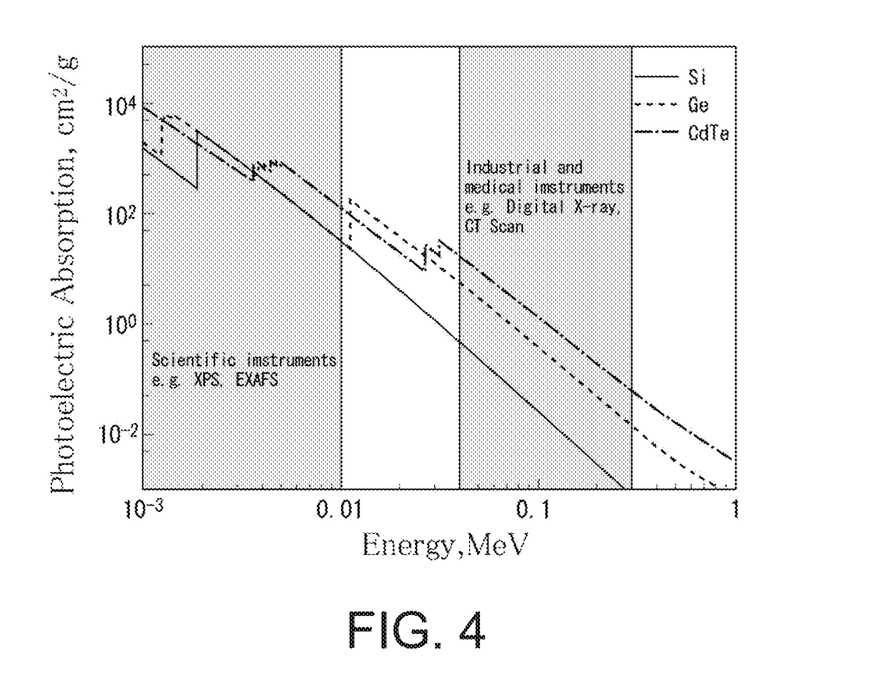
FIG. 4 is a graph of photoelectric absorption coefficient of X-ray depending on substrate types.

FIG. 4 is a graph of photoelectric absorption of X-rays depending on the type of substrate. The three materials Si, Ge, and cdTe were used as the substrate, and the photoelectric absorption when irradiated with X-rays was shown by electron energy [MeV] on the horizontal axis and photoelectric absorption [cm$^2$/g] on the vertical axis. For ultra-high energy photons in the keV region, Ge exhibits excellent performance especially in the range of 1 keV to 10 keV. Both Si and CdTe offer comparable performance, but Ge and Si have the advantages of idiosyncrasy and stability. At around 100 keV, CdTe, which is a High-Z material, exhibits excellent performance. Ge still offers reasonable performance.

From the above, the designing of the photodetector 10 can provide the performance suitable for an optical region required for each application by selecting the type of the second substrate 13 on which the amorphous selenium layer 12 is laminated.

Manufacturing of Amorphous Selenium Layer

The amorphous selenium layer 12 is preferably manufactured by a rotational evaporation method. Selenium (hereinafter, Se) is, for example, 2-3 mm in size and has a purity of 99.999%, and arsenic triselenide (hereinafter, As$_2$Se$_3$) is, for example, in powder form and has a purity of 99.999% (arsenic), is suitable and can be obtained from a drug manufacturer or the like.

Figure 5:
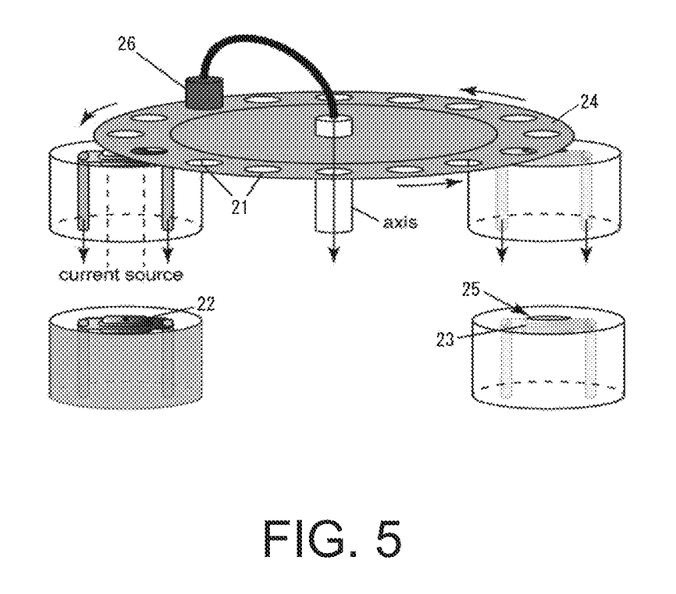
FIG. 5 illustrates a rotational evaporator according to the embodiments.

Next, a method for manufacturing the amorphous selenium layer 12 using the above Se and As$_2$Se$_3$ will be described. FIG. 5 illustrates a rotational evaporator of a rotational evaporation (vacuum rotary vapor deposition) method performed in the embodiment. The rotational evaporation method of FIG. 5 is an example, and it is not denied that other vapor deposition methods are adopted. First, a cleaned substrate 13 such as silicon or glass is set in a sample holder 21. Next, boats 22 and 23 having a slit 25 are filled with the evaporation sources of Se and As$_2$Se$_3$, and the boats 22 and 23 are set under a turntable 24, respectively. The boats 22 and 23 are connected to a power source, and the temperature can be raised by resistance heating. Next, the inside of the bell jar is exhausted until the degree of vacuum reaches about 1×10$^{-6}$ Torr. When the exhaust is completed, currents of 40 A and 45 A are flown to the boats 22 and 23 to heat them. The turntable 24 is rotated at, for example, 80 RPM, and when the heating is stable, shutters installed above the boats 22 and 23 are opened to start vapor deposition. The layer thickness can be monitored by a crystal oscillator 26. The number of layers coincides with the number of rotations of the turntable 24. The layer thickness can be controlled by changing the size of the slit 25, and the number of layers can be controlled by changing the rotation speed.

Figure 6:
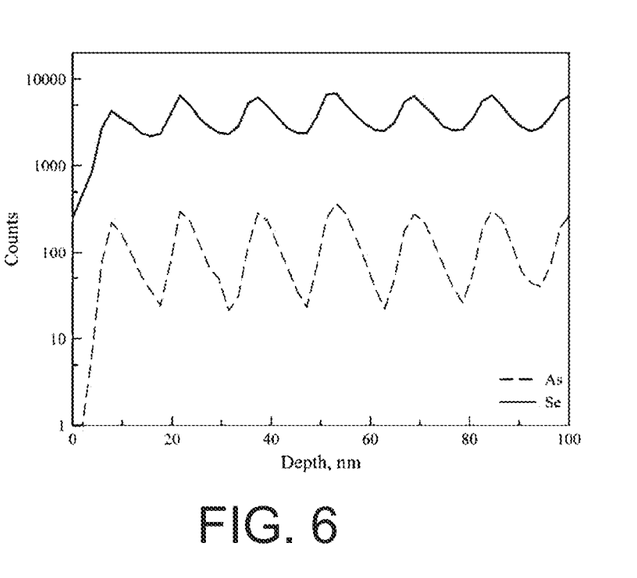
FIG. 6 is a depth profile of layers fabricated by the rotational evaporator indicated in FIG. 5 using Time-Of-Flight Secondary Mass Spectroscopy (Tof-SIMS).

FIG. 6 shows the results of the depth profile of the elemental (analysis in the depth direction of) the amorphous selenium layer 12 formed by the rotational evaporation method of FIG. 5 by time-of-flight secondary ion mass spectrometry (TOF-SIMS). The horizontal axis shows the depth profile of the sample surface, and the vertical axis shows the signal intensity due to each element. From this result, the concentration distribution of atoms in the laminated thin layer becomes clear. From the graph shown in FIG. 6, the signal intensities caused by Se and As change periodically as the depth becomes deeper from the surface, and the laminated layer was manufactured by using the rotational evaporation method.

Figure 7:
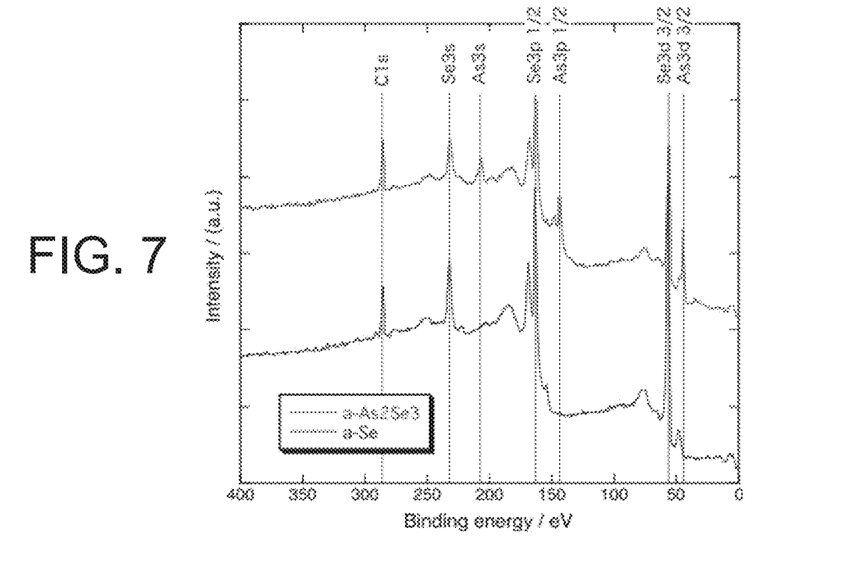
FIG. 7 is a graph of X-ray Photoelectron Spectroscopy (XPS) spectra of the layers fabricated by the rotational evaporator indicated in FIG. 5.

FIG. 7 is an XPS spectrum of an amorphous selenium (a-Se) elemental layer and an amorphous arsenic triselenated arsenic (a-As$_2$Se$_3$) elemental layer manufactured by the rotational evaporation method of FIG. 5. From the spectrum of a-Se, the amorphous selenium layer 12 of the photodetector 10 shows peaks (230 eV, 165 eV, 55 eV) caused by selenium just the same as the material used as the vapor deposition source, and it is confirmed that there is less than 0.1% of other elements. The spectrum of a-As$_2$Se$_3$, the amorphous selenium layer 12 of the photodetector 10 has peaks caused by selenium and arsenic (Se: 230 eV, 165 eV, 55 eV, As: 210 eV, 145 eV, 48 eV) caused by selenium just the same as the material used as the vapor deposition source, and it is confirmed that there is less than 0.1% of other elements. Further, as compared with the vapor deposition source, it can be seen that the influence of C contamination and the oxygen termination on the outermost surface is reduced because it is once decomposed by heat and then deposited. Furthermore, it was confirmed that the stoichiometry ratio of Se and As$_2$Se$_3$ was about Se:As=4:1.

From the above results, by using the rotational evaporation method of FIG. 5, the amorphous selenium layer 12 can be manufactured as a laminated layer without being contaminated with carbon or oxygen, and it is possible to adjust the number of layers.

Designing of Amorphous Selenium Layer

The photodetector 10 realizes a high gain by superlattice Quantum Tunneling Multiplication of the amorphous selenium layer 12. The superlattice structure of Se and As$_2$Se$_3$ forms a mini-band energy level. Carriers such as electrons and holes dominate these energy levels and are conned between superlattice quantum well barriers. There is always a possibility that the carriers will tunnel, but by applying an external electric field, the width of the barrier can be reduced, and the tunneling probability in the direction of the electric field from the quantum well to the quantum well can be increased.

Figure 8:
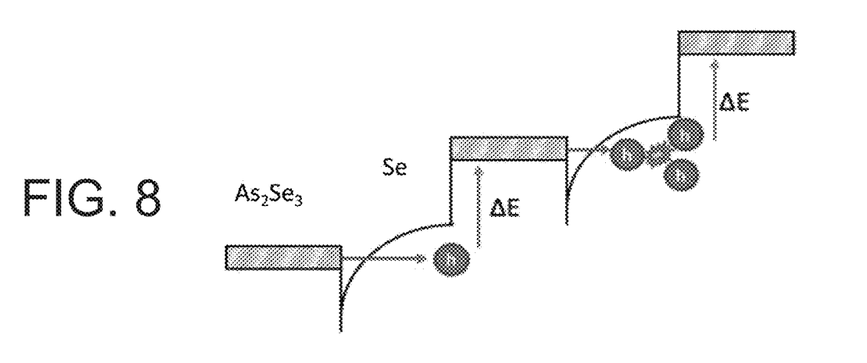
FIG. 8 illustrates a quantum tunneling multiplication process.

In the holes in the amorphous selenium superlattice, the holes can be tunneled from the As$_2$Se$_3$ quantum well through the Se barrier. FIG. 8 shows a model of this. That is, when the holes h pass through the tunnel from the mini-band of the quantum well of $As_2Se_3$, they obtain the energy from the band mismatch and use it for the impact ionization to generate more holes.

When one or some hole passes through the Se barrier, impact ionization is possible if sufficient kinetic energy is obtained for the holes to collide and release other holes. The multiplication factor M generated in this process is expressed by Equation (1).

$$M = N_{SL} \exp(\alpha_{SL} l) \quad \text{[Numerical Equation 1]}$$

Here, l is the thickness of the Se barrier alone. Each superlattice structure is composed of a Se barrier and an $As_2Se_3$ quantum well, and the total thickness of the amorphous selenium superlattice structure is "$2 N_{SL} l$". The Ionization coefficient "$\alpha$ SL" represents the probability of causing impact ionization for the holes reached the threshold energy E th. The thickness l is 10 nm or less in order to maintain the quantum characteristics, and the ionization coefficient "$\alpha$ SL" is on the order of $10^{-4}$ $[m^{-1}]$. This means that the exponential term can be "1 (unity)" approximately.

Therefore, $$M \approx N_{SL} \quad \text{[Numerical Equation 2]}$$

As shown in Equation (2), the multiplication factor M depends on the number of layers $N_{SL}$ of the superlattice structure. Therefore, by controlling the number of layers $N_{SL}$ of the amorphous selenium superlattice structure, it represents the performance of the photodetector 10 can be customized.

Indices such as sensitivity, responsiveness, and quantum efficiency are examples of numbers used to evaluate the performance of the photodetector 10. The sensitivity S at the wavelength $\lambda$ is calculated as in Equation (3).

$$S(\lambda) = \frac{I_C}{P(\lambda)} [A/W] \quad \text{[Numerical Equation 3]}$$

Here, P is an incident light power at that wavelength $\lambda$, the $I_c$ is a collector current from the light receiving device. Sensitivity and quantum efficiency $\eta$ are related as in Equation (4).

$$S(\lambda) = \frac{\eta \lambda}{1240} \quad \text{[Numerical Equation 4]}$$

Here, $\lambda$ has a unit of [nm].

The incident light having the wavelength $\lambda$ and the incident light power P $[W/m^2]$ carries the photon amount $N_0$ calculated as in Equation (5).

$$N_o = \frac{P\lambda}{hc} \quad \text{[Numerical Equation 5]}$$

Here, h is Planck's constant and c is speed of light. These photons produce a pair of electrons $N_{00}$ and holes in the active region A $[m^2]$ of the photodetector 10. Relation of electron $N_{00}$ and amount of photons $N_0$ is shown in Equation (6).

$$N_{00} = N_0 A \quad \text{[Numerical Equation 6]}$$

The resulting current "$I_{ph}$" resulting from these carriers is described as Equation (7).

$$I_{ph} = q N_{00} \quad \text{[Numerical Equation 7]}$$

Here, q is a basic electronic charge.

In general, any detector has a characteristic dark current $I_D$. The photodetector 10 of the embodiment, which has a signal amplification effect due to the amorphous selenium layer 12, multiplies the photocurrent when a bias voltage is applied to the device. Therefore, the collector current $I_c$ has a multiplication factor M as in Equation (8).

$$I_C = M I_{ph} + I_D \quad \text{[Numerical Equation 8]}$$

Then, according to the requirements of desired application, the wavelength $\lambda$ and the incident light power P at that wavelength are known, so that the current $I_{ph}$ can be obtained. Depending on application requirements, also the dark current $I_D$ of the device is determined, using the current required for the external circuit, the collector current $I_c$ is also selected. Therefore, from the Equation (8), the multiplication factor M, which is the required gain, is determined by Equation (9).

$$M = \frac{I_C - I_D}{I_{ph}} \quad \text{[Numerical Equation 9]}$$

Using the Equation (7), the Equation (9) can be written as Equation (10).

$$M = \frac{I_C - I_D}{q N_{00}} \quad \text{[Numerical Equation 10]}$$

Here, since there is a relation of the Equation (2), the number of layers $N_{SL}$ of the amorphous selenium superlattice structure can be determined by obtaining the multiplication factor M.

In addition, it is necessary to apply voltage in order to operate a device. In the photodetectors 10 and 10' of the embodiments, the following three types of voltages are required.

(1) Voltage to prevent recombination of electron-hole pairs generated by incident light (separation voltage),
(2) Voltage/electric field required to cause carrier multiplication in the amorphous selenium layer 12, and
(3) Voltage required to transport these carriers to the electrodes placed on the device. Usually, it is necessary to apply a voltage exceeding (2), which is assumed to be the highest among these three types of voltages (hereinafter, the voltage exceeding (2) referred to as a threshold voltage).

As described above, the Equation (10) was obtained by considering Superlattice Quantum Tunneling Multiplication in quantum mechanics Thus, depending on application requirements, as the factor $I_C$, $I_D$, and $N_{00}$, in the Equation (10), can be determined, it is possible to obtain a multiplication factor M required. Then, by obtaining the multiplication factor M, the number of layers $N_{SL}$ in the amorphous selenium superlattice structure forming the amorphous selenium layer 12 can be determined so that it is possible to meet the application requirements.

In the case of the photodetector 10' according to the second embodiment, an experimental multiplication factor M (exp) may be larger than a calculated (designed) multiplication factor M (cal). This is because of the low dark current due to high impedance originated from the structure having the diamond cold cathode layer 18 and the vacuum gap 17. In detail, a field emission current is negligibly small unless there is a threshold potential difference between the amorphous selenium layer (amorphous Se anode) 12 and the diamond cold cathode layer 18. Therefore, when the diamond cold cathode layer 18 and the vacuum gap 17 are used, the calculated multiplication factor M (cal) needs to be multiplied by the correction coefficient γ as shown in Equation (11) in consideration of the increase in the input impedance.

$$M_{(exp)} \approx \gamma M_{(cal)} \qquad \text{[Numerical Equation 11]}$$

EXAMPLES

Next, device designings were performed assuming some application requirements.

These device designing may be implemented by software, for example, electronic circuits such as a CPU (Central Processing Unit), an ASIC (Application Specific Integrated Circuit), a PLD (Programmable Logic Device) such as an FPGA (Field Programmable Gate Array). A program, which consists of electronic circuits, reads numerical values from a memory device that stores the numerical values of each factor necessary for the above shown calculations according to the application requirements. Then, the program combines photodetector form, layer design, and substrate selection, implements preferable device designing to achieve performance desired by desired application.

Example 1

(Green Light Detector)

Requirements: It is assumed that this application needs to detect green light (visible light) with a wavelength of 520 nm with a minimum incident light power of 5 μW/cm². As the photodetector, the photodetector 10 (imaging device form) of the first embodiment is adopted. The external readout circuit connected to the photodetector requires a current of at least 150 nA. The application allows dark current up to 50 nA.

The energy E of a single photon having λ=520 nm is obtained as shown in Equation (12).

$$E = \frac{hc}{\lambda} \qquad \text{[Numerical Equation 12]}$$

$$E[J] = \frac{1.98 \times 10^{-16} \, [\text{J/nm}]}{\lambda \, [\text{nm}]}$$

$$E[J] = 3.8 \times 10^{-19} [J]$$

When the photon energy E, having P=5 μW/cm², is incident on a photodetector with an active area of 1 mm², the electron (the number of photons) $N_{00}$ is obtained as shown in Equation (13).

$$N_{00} = \frac{P[W]}{E[J]} \times A \qquad \text{[Numerical Equation 13]}$$

$$N_{00} = 1.3 \times 10^{11} [s^{-1}]$$

Here, from the requirements, the collector current $I_c$ is 150, the dark current $I_D$ is 50. Using the Equation (10), the calculated multiplication factor M (cal) can be obtained from Equation (14).

$$M = \frac{(150 - 50) \, [\text{nA}]}{1.6022 \times 10^{-19} [C] \times 1.3 \times 10^{11} [s^{-1}]} \qquad \text{[Numerical Equation 14]}$$

$$M \approx 5$$

Therefore, from the Equation (2), the photodetector 10 satisfying the above requirements needs to have at least "5" layers in the amorphous selenium superlattice structure. Here, the thickness l of the Se barrier alone is 8 nm. Multiplication only occurs in the Se barrier. Since each superlattice is composed of a Se barrier (8 nm) and an $As_2Se_3$ quantum well (also 8 nm), the thickness of the amorphous selenium superlattice structure per layer is 16 nm. From the above, the layer thickness of the amorphous selenium layer 12 (total thickness of the amorphous selenium superlattice structure) required for the application is at least 16 nm×5 layers (or, 2×8 nm×5 layers)=80 nm.

Example 2

(Blue Light Detector)

Requirements: This application needs to detect blue light (visible light) with a wavelength of 470 nm with a minimum incident light power of 5 μW/cm². As the photodetector, the photodetector 10 (imaging device form) of the first embodiment is adopted. The external readout circuit connected to the photodetector requires a current of at least 200 nA. The application allows dark currents up to 50 nA.

The energy E of a single photon at λ=470 nm is obtained as shown in Equation (15).

$$E = \frac{hc}{\lambda} \qquad \text{[Numerical Equation 15]}$$

$$E[J] = \frac{1.98 \times 10^{-16} \, [\text{J/nm}]}{\lambda \, [\text{nm}]}$$

$$E[J] = 4.2 \times 10^{-19} [J]$$

When the photon energy E, having P=5 μW/cm², is incident on a photodetector with an active area of 1 mm², the number of photons $N_{00}$ can be obtained according to Equation (16).

$$N_{00} = \frac{P[W]}{E[J]} \times A \qquad \text{[Numerical Equation 16]}$$

$$N_{00} = 1.2 \times 10^{11} [s^{-1}]$$

Here, from the requirements, the collector current $I_c$ is 200, the dark current $I_D$ is 50. Using the Equation (10), the calculated multiplication factor M (cal) can be obtained from Equation (17).

$$M = \frac{(200 - 50) \, [\text{nA}]}{1.6022 \times 10^{-19} [C] \times 1.2 \times 10^{11} [s^{-1}]} \qquad \text{[Numerical Equation 17]}$$

$$M \approx 8$$

Therefore, from the Equation (2), the photodetector 10 satisfying the above requirements needs to have at least "8" layers in the amorphous selenium superlattice structure. Since the thickness of the amorphous selenium superlattice structure per layer is 16 nm, the layer thickness of the amorphous selenium layer 12 (total thickness of the amorphous selenium superlattice structure) required for the application is at least 16 nm×8 layers (or, 2×8 nm×8 layers)=128 nm.

Example 3

(Ultraviolet Light Detector)

Requirements: In this application, the UV LED provides an incident power of 15 mW/m² at a wavelength of 375 nm. As the photodetector, the photodetector 10' (vacuum type imaging device form) of the second embodiment is adopted. The external readout circuit connected to the photodetector requires a current of at least 100 nA. The application allows dark currents up to 1 nA. The active region A from the diamond cold cathode layer 18 is a 100 μm square.

The photon energy E at wavelength λ=375 nm is obtained according to Equation (18).

$$E = \frac{hc}{\lambda}$$ [Numerical Equation 18]

$$E[J] = \frac{1.98 \times 10^{-16} \, [J/nm]}{\lambda \, [nm]}$$

$$E[J] = 5.3 \times 10^{-19} [J]$$

When the photon energy E, having P=15 mW/m², is incident on a photodetector with an active area of 0.01 mm², the number of photons $N_{00}$ is calculated as shown in Equation (19).

$$N_{00} = \frac{P[W]}{E[J]} \times A$$ [Numerical Equation 19]

$$N_{00} = 2.9 \times 10^8 [s^{-1}]$$

Here, from the requirements, the collector current $I_c$ is 100, the dark current $I_D$ is 1. Using the Equation (10), the calculated multiplication factor M (cal) can be obtained from Equation (20).

$$M = \frac{(100-1) \, [nA]}{1.6022 \times 10^{-19} [C] \times 2.9 \times 10^8 [s^{-1}]}$$ [Numerical Equation 20]

$$M \approx 104$$

Therefore, from the Equation (2), the photodetector 10' satisfying the above requirements needs to have at least "104" layers in the amorphous selenium superlattice structure. Since the thickness of the amorphous selenium superlattice structure per layer is 16 nm, the layer thickness of the amorphous selenium layer 12 (total thickness of the amorphous selenium superlattice structure) required for the application is at least 16 nm×104 layers (or, 2×8 nm×104 layers)=1664 nm.

Example 4

(X-Ray Photodetector)

Requirements: This application needs to detect X-rays with a minimum incident light power of 7.5 mW/m². As the photodetector, the photodetector 10 (imaging device form) of the first embodiment is adopted. The external readout circuit connected to the photodetector requires a current of at least 5 nA. This application allows dark currents up to 3 nA. The absorption coefficient of the Si layer having a thickness of 500 μm at 30 keV is 0.14, and the ionization coefficient α SL of Si is 3.6 eV.

In the case of X-rays, the energy E has already been given in eV and needs to be converted to joules. The X-ray energy E in joules is obtained according to Equation (21).

$$E[J] = E[eV] * 1.6022 \times 10^{-19}$$

$$E[J] = 3.6 \times 1.6022 \times 10^{-19}$$

$$E[J] = 5.8 \times 10^{-19} [J]$$ [Numerical Equation 21]

By adjusting the ionization coefficient, the absorption coefficient, and the active area of 100 μm² from the tungsten tip, the number of photons $N_{00}$ generated in the Si absorber can be obtained as shown in Equation (22).

$$N_{00} = \frac{P[W]}{E[J]} \times A \times \frac{30 \, [keV]}{3.6 \, [keV]} \times 0.14$$ [Numerical Equation 22]

$$N_{00} = 1.5 \times 10^8 [s^{-1}]$$

Here, from the requirements, the collector current $I_c$ is 5, the dark current $I_D$ is 3. Using the Equation (10), the calculated multiplication factor M (cal) can be obtained from Equation (23).

$$M = \frac{(5-3) \, [nA]}{1.6022 \times 10^{-19} [C] \times 1.5 \times 10^8 [s^{-1}]}$$ [Numerical Equation 23]

$$M \approx 83$$

Therefore, from the Equation (2), the photodetector 10 satisfying the above requirements needs to have at least "83" layers in the amorphous selenium superlattice structure. Since the thickness of the amorphous selenium superlattice structure per layer is 16 nm, the layer thickness of the amorphous selenium layer 12 (total thickness of the amorphous selenium superlattice structure) required for the application is at least 16 nm×83 layers (or, 2×8 nm×83 layers) =1330 nm.

Example 5

(Infrared Light Detector)

Requirements: It is assumed that this application needs to detect infrared light with a wavelength of 940 nm with a minimum incident light power of 5 μW/cm². As the photodetector, the photodetector 10 (imaging device form) of the first embodiment is adopted. The external readout circuit connected to the photodetector requires a current of at least 250 nA. The application allows dark currents up to 50 nA.

The energy E of a single photon at λ=940 nm is obtained according to Equation (24).

$$E = \frac{hc}{\lambda}$$ [Numerical Equation 24]

$$E[J] = \frac{1.98 \times 10^{-16} \, [J/nm]}{\lambda \, [nm]}$$

-continued $$E[J] = 2.1 \times 10^{-19} [J]$$

When the photon energy E, having P=5 μW/cm², is incident on a photodetector with an active area of 1 mm², the number of photons $N_{00}$ can be obtained according to the Equation (25).

$$N_{00} = \frac{P[W]}{E[J]} \times A \quad \text{[Numerical Equation 24]}$$

$$N_{00} = 2.4 \times 10^{11} [s^{-1}]$$

Here, from the requirements, the collector current $I_c$ is 250, the dark current $I_D$ is 50. Using the Equation (10), the calculated multiplication factor M (cal) can be obtained from Equation (26).

$$M = \frac{(250-50) \,[\text{nA}]}{1.6022 \times 10^{-19} [C] \times 2.4 \times 10^{11} [s^{-1}]} \quad \text{[Numerical Equation 26]}$$

$$M \approx 5$$

Therefore, from the Equation (2), the photodetector 10 satisfying the above requirements needs to have at least "5" layers in the amorphous selenium superlattice structure. Since the thickness of the amorphous selenium superlattice structure per layer is 16 nm, the layer thickness of the amorphous selenium layer 12 (total thickness of the amorphous selenium superlattice structure) required for the application is at least 16 nm×5 layers (or, 2×8 nm×5 layers)=80 nm.

Verification

Experiments were performed on several patterns to prove the above examples.

Experiment 1

Figure 9:
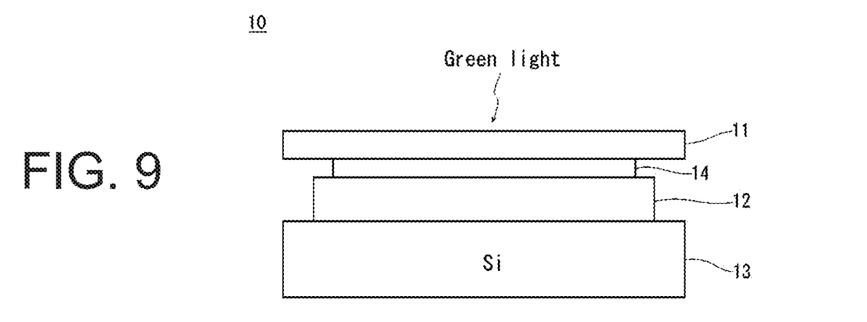
FIG. 9 is a device configuration of a photodetector for green light detection.
Figure 10:
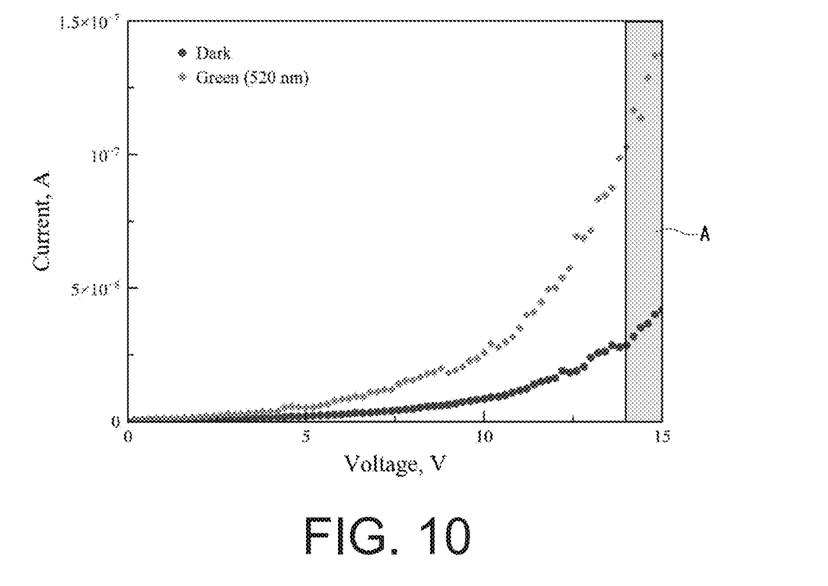
FIG. 10 is a graph of Current-Voltage characteristics of the device indicated in FIG. 9.

Photodetector for green light: A configuration of the device is shown in FIG. 9. For the photodetector, the form of the imaging device (10) was selected. The device includes a first substrate 11 having a transparent electrode 14, an amorphous selenium layer 12, and a second substrate 13. Since the target of the application is the visible light region, an n-type Si substrate was selected as the second substrate 13. The amorphous selenium layer 12 was manufactured by the rotational evaporation method in which a "5-layer" superlattice structure was formed from the result of the calculated multiplication factor M≈5. Thereafter, green light of 520 nm was irradiated under a power of 5 μW/cm² of light irradiation, and the light receiving device was measured using the current-voltage characteristics. The result is shown in FIG. 10. The vertical axis is the applied current [A], and the horizontal axis is the voltage change [V] at that time.

From FIG. 10, $I_C$ was obtained from the graph of "Green", and $I_D$ was obtained from the graph of "Dark". At that time, due to the presence of the threshold voltage described in "Designing of Amorphous Selenium Layer", the value of the threshold voltage of 14 V to 15 V for the active region (reference sign "A" in FIG. 10) was used, which has a high probability of entering a normal operating mode. Similarly, the number of photons $N_{00}$ was determined from the power P and the active region A. As shown in FIG. 9, the photodetector's form does not have a vacuum gap so that γ=1.

The experimental M (exp) obtained from the above factors was 5.5 to 7.5. These values are in very good agreement with the calculated M (cal), which predicted M≈5.

Experiment 2

Figure 11:
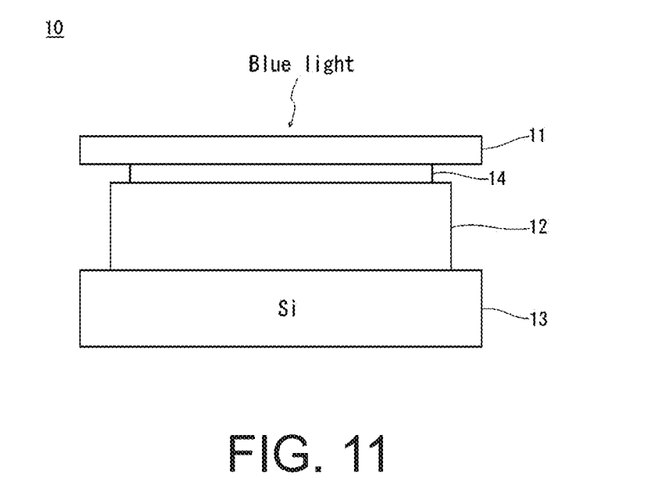
FIG. 11 is a device configuration of a photodetector for blue light detection.
Figure 12:
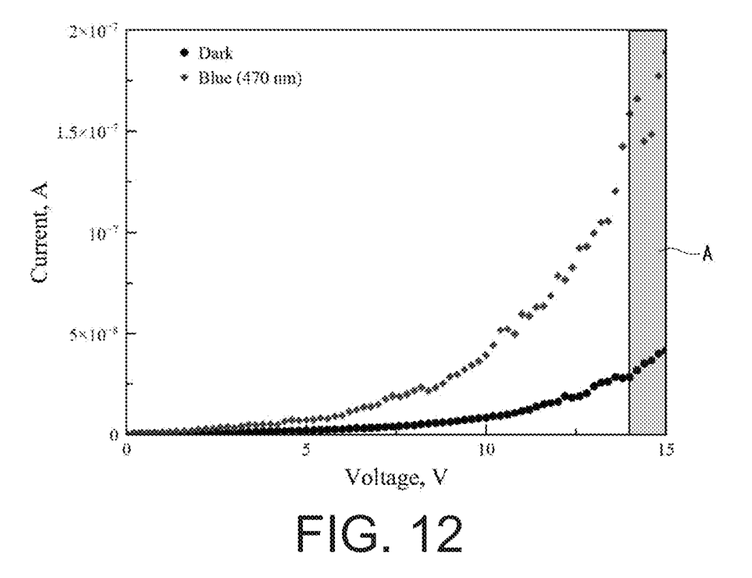
FIG. 12 is a graph of Current-Voltage characteristics of the device indicated in FIG. 11.

Blue light photodetector: A configuration of the device is shown in FIG. 11. For the photodetector, the configuration of the imaging device (10) was selected. The device includes a first substrate 11 including a transparent electrode 14, an amorphous selenium layer 12, and a second substrate 13. Since the target of the application is the visible light region, an n-type Si substrate was selected for the second substrate 13. For the amorphous selenium layer 12, a superlattice structure having "8-layers" was formed by the rotational evaporation method from the result of the calculated multiplication factor M≈8. Thereafter, blue light of 470 nm was irradiated under a power of 5 μW/cm² of light irradiation, and the light receiving device was measured using the current-voltage characteristics. The result is shown in FIG. 12. The vertical axis is the applied current [A], and the horizontal axis is the voltage change [V] at that time.

From FIG. 12, $I_C$ was obtained from the graph of "Blue", and $I_D$ was obtained from the graph of "Dark". At that time, due to the presence of the threshold voltage described in "Designing of Amorphous Selenium Layer", the value of the threshold voltage of 14 V to 15 V for the active region (reference sign "A" in FIG. 12) was used, which has a high probability of entering a normal operating mode. Similarly, the number of photons $N_{00}$ was determined from the power P and the active region A. As shown in FIG. 11, the photodetector's form does not have a vacuum gap so that γ=1.

The experimental M (exp) obtained from the above factors was 7 to 12. These values are in very good agreement with the calculated M (cal), which predicted M≈8.

Experiment 3

Figure 13:
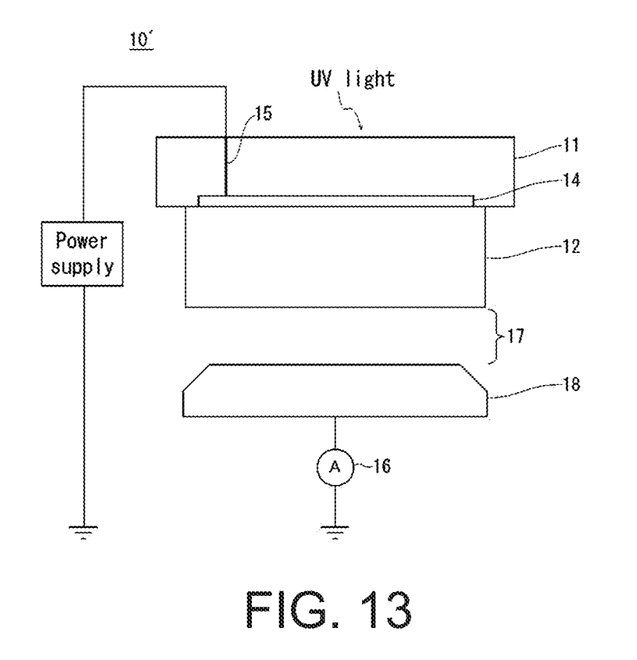
FIG. 13 is a device configuration of a photodetector for ultra-violet light detection.
Figure 14:
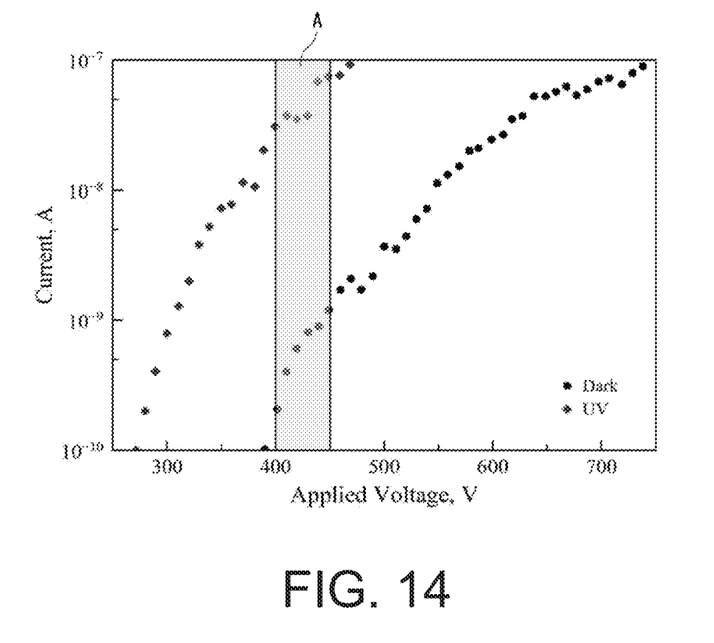
FIG. 14 is a graph of Current-Voltage characteristics of the device indicated in FIG. 13.

Ultraviolet light photodetector: A configuration of the device is shown in FIG. 13. For the photodetector, the form of the vacuum type imaging device (10') was selected. The device includes a glass substrate 11 including a transparent electrode 14, an amorphous selenium layer 12 (anode layer), a vacuum gap 17 having 60 um, and a nitrogen-doped diamond cold cathode layer 18. For the amorphous selenium layer 12, a superlattice structure having "104-layers" was formed by the rotational evaporation method from the result of the calculated multiplication factor M≈104. Thereafter, ultraviolet ray of 375 nm was irradiated under a power of 15 mW/m² of light irradiation, and the light receiving device was measured using the current-voltage characteristics. The result is shown in FIG. 14. The vertical axis is the applied current [A], and the horizontal axis is the voltage change [V] at that time.

From FIG. 14, $I_C$ was obtained from the graph of "UV", and $I_D$ was obtained from the graph of "Dark". At that time, due to the presence of the threshold voltage described in "Designing of Amorphous Selenium Layer", the value of the threshold voltage of 400 V to 450 V for the active region (reference sign "A" in FIG. 14) was used, which has a high probability of entering a normal operating mode. Similarly, the number of photons $N_{00}$ was determined from the power P and the active region A.

The experimental M (exp) obtained from the above factors was 1100. This is significantly larger than the calculated M (cal) of 104. However, since the photodetector 10' has the vacuum gap 17, the multiplication factor M is corrected by the Equation (11). The dependence of emission current on the vacuum gap 17 of the cold cathode layer 18 of diamond was reported in, for example, K. Okano et al., Electron emission from N-doped homoepitaxially grown diamond, Journal of Applied Physics 92: 4, 2194-2197. From this result, in the vacuum gap 17 of 60 um, the input impedance increases γ≈10 times, and the calculated M (cal) becomes 1040. This is in good agreement with the experimental M (exp) of 1100.

Experiment 4

Figure 15:
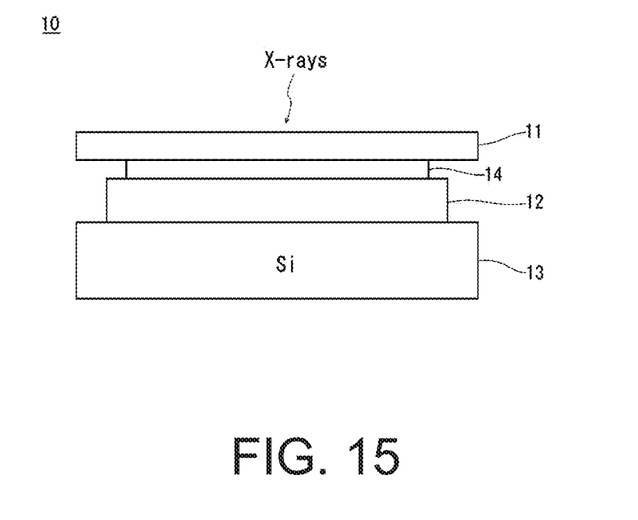
FIG. 15 is a device configuration of a photodetector for X-ray detection.
Figure 16:
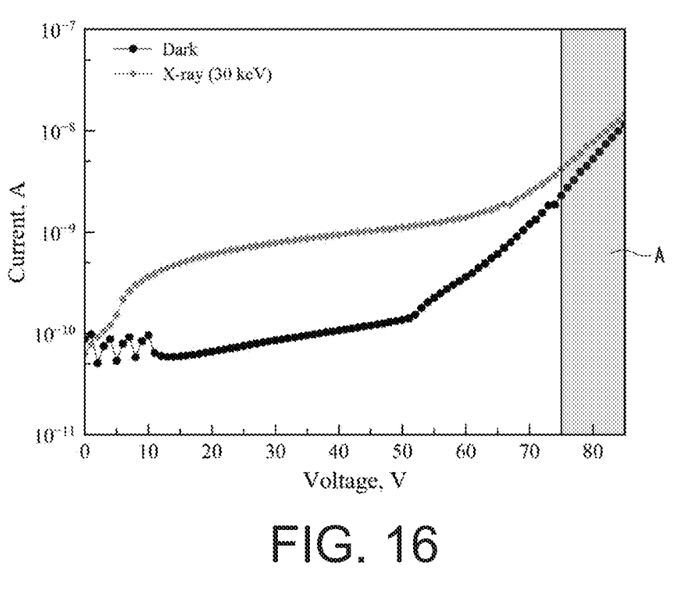
FIG. 16 is a graph of Current-Voltage characteristics of the device indicated in FIG. 15.

X-ray photodetector: A configuration of the device is shown in FIG. 15. For the photodetector, the form of the image device (10) was selected. The device includes a first substrate 11 including a transparent electrode 14, an amorphous selenium layer 12, and a second substrate 13. Since the target of the application is X-rays, an n-type Si substrate having a thickness of 500 μm was selected for the second substrate 13. For the amorphous selenium layer 12, a superlattice structure having "83-layers" was formed by the rotational evaporation method from the result of the calculated multiplication factor M≈83. Thereafter, X-rays were irradiated under a power of 7.5 mW/m² of light irradiation, and the light receiving device was measured using the current-voltage characteristics. The result is shown in FIG. 16. The vertical axis is the applied current [A], and the horizontal axis is the voltage change [V] at that time.

From FIG. 16, $I_C$ was obtained from the graph of "X-ray", and $I_D$ was obtained from the graph of "Dark". At that time, due to the presence of the threshold voltage described in "Designing of Amorphous Selenium Layer", the value of the threshold voltage of 75 V to 85 V for the active region (reference sign "A" in FIG. 16) was used, which has a high probability of entering a normal operating mode. Similarly, the number of photons $N_{00}$ was determined from the power P and the active region A. As shown in FIG. 15, the photodetector's form does not have a vacuum gap so that γ=1.

The experimental M (exp) obtained from the above factors was 68 to 106. These values are reasonably consistent with the calculated M (cal) that predicted M≈83.

From the above verification experiments, it was confirmed that the quantum mechanical device designings proposed in the embodiments are well realized.

Therefore, according to the present invention, the thickness of the photoelectric conversion layer (amorphous selenium layer) that meets the requirements for any application can be easily designed quantum mechanically. In addition, by combining the photoelectric conversion layer with a substrate, it is possible to detect light well in a wide wavelength region of X-ray, ultraviolet light, visible light, and infrared light, thus, any devices with performance according to application requirements can be easily designed.

In the above embodiment, as an alternative to selenium, trigonal selenium, monoclinic selenium, rhombohedric selenium, or vitreous selenium may be used, as an alternative to arsenic triselenide, $As_2S_3$ (arsenic trisulfide), $Sb_2Se_3$ (diantimony triselenide), $As_2Te_3$ (diadenic tritelluride), $P_2Se_3$ (diphosphorus triselenide), CdTe (cadmium telluride), CdSe (cadmium selenide), ZnSe (zinc selenide), ZnTe (zinc telluride), PbSe (lead selenide), GaAs (gallium arsenide), GaP (gallium phosphorus), GaSe (gallium selenide), AlAs (aluminum arsenide), $In_2Se_3$ (Indium selenide), $Se_3Tl_2$ (Dithallium selenide), AlP (aluminum phosphorus), InP (indium phosphorus), AlSb (aluminum antimony), GaSb (gallium antimony), InAs (indium arsenic), InSb (indium antimony), it is also suitable to use these materials, and the amorphous selenium layer and the photodetector used by these are also understood to be included in the scope of the present invention.

REFERENCE SIGNS LIST

10,10' Photodetector
11 First substrate
12 Amorphous selenium layer (photoelectric conversion layer)
13 Second substrate
14 Transparent electrode
15 through hole
16 Readout circuit
17 Vacuum Gap
18 Cold cathode
21 Sample Holder
22 Boat (Se)
23 Boat ($As_2Se_3$)
24 Turntable
25 Slit
26 Crystal oscillator

The invention claimed is:

1. A method for manufacturing a photodetector including a first substrate having a transparent electrode, and a photoelectric conversion layer having a superlattice structure mostly composed of amorphous selenium, for which initial requirements including a minimum incident light power that needs to be detected, a wavelength that needs to be detected, a collector current Ic that a light receiving device connected to the photodetector to be fabricated requires, and a dark current $I_D$ that the photodetector to be fabricated allows have been selected, comprising:

a step of calculating via a CPU and a memory device on the basis of the initially-chosen requirements a multiplication factor M representing an amplification gain generated in a process of tunneling in the superlattice structure; the multiplication factor M being calculated by the following equation:

$$M = \frac{I_C - I_D}{qN_{00}}$$

wherein q is a basic electronic charge, and $N_{00}$ is the number of photons serving as carriers in the tunneling, the numerical values of each factor required for the calculation of the equation being read from the memory device;

a step of determining via the CPU, as a layer thickness of the photoelectric conversion layer, a thickness obtained by multiplying a thickness per one layer of the superlattice structure by the number of layers $N_{SL}$ of the superlattice structure on the assumption that the multiplication factor M is approximate to the number of layers $N_{SL}$, and fabricating the photodetector by laminating the photoelectric conversion layer on the substrate by rotational evaporation by matching the number of layers $N_{SL}$ with the number of rotations of a turntable.

2. The photodetector manufacturing method according to claim 1, wherein when the photodetector has a vacuum gap, and wherein a correction coefficient γ for increasing the multiplication factor M is included in the multiplication factor M.

3. The photodetector manufacturing method according to claim 1, wherein the superlattice structure is made of selenium and arsenic triselenide.

4. A photodetector comprising, in order from a light incidence side:
a first substrate including a transparent electrode;
a photoelectric conversion layer having a superlattice structure mostly composed of amorphous selenium and having a layer thickness obtained by multiplying a thickness per one layer of the superlattice structure by the number of layers $N_{SL}$ of the superlattice structure approximate to a multiplication factor M representing an amplification gain generated in a process of tunneling in the superlattice structure the multiplication factor M being calculated by the following equation:

$$M = \frac{I_C - I_D}{qN_{00}}$$

wherein Ic is a collector current, $I_D$ is an amount of dark current to be allowed by the photodetector, q is a basic electronic charge, and $N_{00}$ is the number of photons serving as carriers in the tunneling; and
a second substrate of a substrate type which is suitable for a requirement for a wavelength to be detected by the photoelectric conversion layer and on which the photoelectric conversion layer is laminated,
wherein only the photoelectric conversion layer determines the amount of dark current $I_D$.

5. A photodetector comprising, in order from a light incidence side:
a first substrate including a transparent electrode,
an anode layer that functions as a photoelectric conversion layer having a superlattice structure mostly composed of amorphous selenium and having a layer thickness obtained by multiplying a thickness per one layer of the superlattice structure by the number of layers $N_{SL}$ of the superlattice structure approximate to a multiplication factor M representing an amplification gain generated in a process of tunneling in the superlattice structure the multiplication factor M being calculated by the following equation:

$$M = \frac{I_C - I_D}{qN_{00}}$$

wherein Ic is a collector current, $I_D$ is an amount of dark current to be allowed by the photodetector q is a basic electronic charge, and $N_{00}$ is the number of photons serving as carriers in the tunneling;
a vacuum gap; and
a cathode layer,
wherein only the anode layer determines the amount of dark current $I_D$.

6. A storage medium storing a computer program of the photodetector manufacturing method according to claim 1 that computes the multiplication factor M for the formula $$M = \frac{I_C - I_D}{qN_{00}}.$$

7. The photodetector according to claim 4 wherein the photoelectric conversion layer is made of selenium and arsenic triselenide.

8. The photodetector according to claim 5 wherein the photoelectric conversion layer is made of selenium and arsenic triselenide.

9. The photodetector manufacturing method according to claim 1 wherein the photoelectric conversion layer is composed of one of Se/GaSe, Se/SbSe, Se/AsTe, Se/PSe, Se/CdTe, Se/CdSe, Se/ZnSe, Se/ZnTe, Se/PbSe, Se/GaP, Se/GaSe, Se/AlAs, Se/InSe, Se/SeT, Se/AlP, Se/InP, Se/AlSb, Se/GaSb, Se/InAs, and Se/InSb.

* * * * *